United States Patent [19]

Shimizu et al.

[11] 4,227,788
[45] Oct. 14, 1980

[54] PRINTED CIRCUIT ASSEMBLY

[75] Inventors: Masami Shimizu, Tokyo; Hiroshi Aizawa, Machida, both of Japan

[73] Assignee: Canon Kabushiki Kaisha, Tokyo, Japan

[21] Appl. No.: 25,721

[22] Filed: Mar. 30, 1979

Related U.S. Application Data

[63] Continuation of Ser. No. 906,669, May 16, 1978, abandoned, which is a continuation of Ser. No. 737,576, Nov. 1, 1976, abandoned.

[51] Int. Cl.³ .................................................. G03B 7/08
[52] U.S. Cl. ................................................... 354/60 R
[58] Field of Search ...................................... 354/60 R

[56] References Cited

U.S. PATENT DOCUMENTS

| | | | |
|---|---|---|---|
| 3,670,639 | 6/1972 | Harnden, Jr. ................. | 354/60 R X |
| 3,846,805 | 11/1974 | Kiyohara et al. ............. | 354/60 R X |
| 3,868,711 | 2/1975 | Sikida et al. .................. | 354/60 R X |
| 3,893,140 | 7/1975 | Yata et al. .................... | 354/60 R X |

*Primary Examiner*—Michael L. Gellner
*Attorney, Agent, or Firm*—Toren, McGeady and Stanger

[57] ABSTRACT

A printed circuit assembly in a device such as a camera, for example, which is constructed in an extremely compact size and in which various mechanical parts are compacted in a hausing and various electrical parts are arranged in the distributed manner within very limited spaces between the mechanical parts and the hausing. In this printed circuit assembly, in order to electrically connect each of the above described electrical parts to the electric circuit portion forming the main portion of the device, flexible printed circuit boards which are so located within the spaces that they are variously bent in conformance with the configuration each of the spaces are each formed as a single continuous base board in such a manner that it has a third plate portion for connecting purpose connected to a first and second main plate portions of the base board extending therefrom at an obtuse angle to each other with the third plate portion located between the first and second main plate portions so as to deviate from the directions in which the latters extend in the manner that, for example, the third plate member is made substantially in the form of a general U-shape, a general semi-circular shape, or a general trapezoidal shape, so that the yield of the material in the pressing operation in the manufacture of the printed circuit boards is raised.

28 Claims, 10 Drawing Figures

PRINTED CIRCUIT ASSEMBLY

This is a continuation of Patent Application, Ser. No. 906,669 filed May 16, 1978, which in a continuation of Patent Application, Ser. No. 737,576, filed Nov. 1, 1976, both abandoned.

BACKGROUND OF THE INVENTION

1. Field of the Invention

The present invention relates to a printed circuit assembly in a device such as a camera, for example, in which various mechanical parts are compacted in a housing and various electrical parts are distributedly arranged in very restricted spaces between the mechanical parts and the housing, the printed circuit assembly being provided with a highly compacted electric circuit for electrically controlling various operations of said device. Particularly, it relates to improvements in a printed circuit assembly for electrically converting to the above described electric circuit each of the above described electrical parts adapted to be equipped in the very restricted spaces between the above described mechanical parts and the housing.

For the better understanding of the present invention, a description will be given below of the printed circuit assembly of the type described above used in the field of the camera. However, it is apparent that the present invention is not limited to the scope as described below, but it is sufficiently applicable to various field other than the camera.

2. Description of the Prior Art

Speaking of the camera, electronization has recently advanced particularly in the technique of the operation of the exposure, and it has widely practiced to compact various electrical parts in the camera together with the electric circuit forming the main part of the exposure mechanism so as to electrically control various actuations of the exposure mechanism, and such a tendency has been especially remarkable together with the recent development of the IC techniques.

On the other hand, in the field of camera, the minimization of the size of the camera has heretofore been severely desired. Since major portion of the entire volume in the camera housing is occupied by various mechanical parts, only very restricted spaces distributedly formed in the camera housing are left for arranging therein various electrical parts required for electrically controlling various actuations related to the exposure operation as well as the essential electric circuit. Thus, these electrical parts and the essential electric circuit are necessarily distributedly arranged in such very restricted spaces.

Therefore, in a camera of such a type, wiring operation is very troublesome to electrically connect the respective electrical parts distributedly arranged in the camera housing by using lead wires, and the efficiency of assembling the camera is extremely deteriorated. In addition, the damage of the lead wires or failure in the electrical connection thereof will increase. To avoid the above disadvantages, it is desirable that almost all the electrical parts except those which are in direct interface relationship to the mechanical parts of the camera are arranged on the printed circuit chips in the integrated form together with the essential electric circuit so as to make the volume as small as possible, and electrical conductors for electrically connecting the respective electrical parts distributedly arranged in the camera housing to the integrated circuit portion are formed on the printed circuit chips by the printing thereby constructing a so-called printed circuit assembly and the printed circuit assembly is arranged within the very restricted spaces in the interior of the camera.

For example, taking a single lens reflex camera as an example, electrical parts which are in direct interface relationship to the mechanical parts such as various resistors for applying inputs indicative of the film sensitivity, the shutter time, or the diaphragm aperture to the exposure control circuit and switches and electromagnets for controlling the operation of the shutter mechanism are mainly distributedly arranged in the spaces between the upper side of the mechanical portion in the camera and the upper cover of the camera and between the lower side of the mechanical portion and the bottom cover of the camera, and the essential electric circuit portion effecting the operational calculation of the exposure and the control of the exposure is formed in integrated form and arranged in the space between the pentagonal roof prism and the upper cover of the camera, and these portions are electrically connected by means of flexible printed circuit chips.

In the printed circuit assemblies of the type described above, when it is intended to form the printed circuit chip in a single continuous base plate, it is necessary to arrange the printed circuit chip in variously bent form so as to extend from the upper side of the mechanical portion through the front side thereof to the lower side of the mechanical portion, in order to effect efficient connection of the various electrical parts distributedly arranged in the upper and lower sides of the mechanical portion to the essential electric circuit. Particularly, it is almost impossible to arrange the printed circuit chip passing across the front side of the mechanical portion so as to be located at the side surface of the mechanical portion.

Therefore, in case the printed circuit chip is formed as a single continuous base plate, the configuration of such a printed circuit chip when extended in a plane must necessarily be in the L-shape thereby deteriorating the yield of the material in punching operation for forming the printed circuit chips, because waste portions of the material must be increased due to the L-shape of the printed circuit chip.

In order to eliminate the above described disadvantages, it has been proposed to divide the printed circuit chip into a plurality of sections so as to form them from the material, respectively, and then to join them together by soldering so as to form the printed circuit chip. In this case, troublesome soldering operation is required for electrically connecting the printed conductors at the joined portions of the printed circuit chip. Further, the electrical connection by soldering is less reliable and failure in electrical connection or damage in the electric circuit might occur.

On the other hand, as to the material for producing such flexible printed circuit chips, heat resisting, electrically insulating synthetic resin is used such as polyester group, or polyamide group or the like. These materials are very expensive and, therefore, it will cause obstacles in lowering the price of the camera if the yield of the material for forming the printed circuit chips is made low thereby raising the cost of the printed circuit chips per se.

SUMMARY OF THE INVENTION

The present invention is developed in view of the above described circumstances, and the principal object of the present invention is to render the price of the printed circuit chips to be low by raising the efficiency or yield of the material of the printed circuit chips in forming the printed circuit chips in a printed circuit assembly as a single flexible continuous base plate, the printed circuit chips being adapted to be bent into a configuration, so as to bit in a desired space.

Another object of the present invention is to provide an improved construction of a printed circuit chip which can be produced at a low cost by raising the yield of the material of the printed circuit chip in forming the same as a single continuous base plate from a single plate material, the printed circuit chip being flexible and adapted to be incorporated in a printed circuit assembly which is accomodated in a very restricted space in a very compact device such as a camera, the printed circuit chip being permitted to be arranged in a very restricted space even though it must be positioned in such a manner that at least two main plate portions thereof be oriented in substantially perpendicularly intersecting relationship to each other.

A further object of the present invention is to provide an improved concrete construction of a printed circuit chip which is inexpensive in manufacture by raising yield of the material of the printed circuit chip without causing waste of the material and which is distributedly arranged within very restricted spaces between a housing of a camera and various mechanical parts for the photographing compacted within the housing in order to electrically connect various electrical parts for controlling the exposure to the essential electric circuit for the operational calculation and/or the control of the exposure, the printed circuit chip being variously bent in complicated configuration in conformance with the configuration of the spaces.

The above objects are achieved in accordance with the present invention in such a manner that the flexible printed circuit chip which is adapted to be bent into a configuration so as to fit in a desired space is formed from a single continuous base plate with at least a first and a second main plate portion being provided extending at an obtuse angle to each other while a third plate portion for electrical connecting purpose is joined to these two main plate portions in such a manner that it deviates from the directions in which the first and the second main plate portion extend and located between the first and the second main plate portion, the first and the second main plate portion being formed in a generally elongated shape in its extended state in a plane despite the fact that the first and the second main plate portion must be arranged in substantially perpendicularly intersecting relationship to each other.

In other words, the characteristic feature of the present invention lies in the construction of the improved printed circuit chip which is produced at a very low cost by raising the yield of the material of the printed circuit chip without causing waste of the material in forming the printed circuit chip as a single continuous base plate despite of the fact that it is variously bent into various configuration so as to be accommodated in desired configuration of the space.

In accordance with preferred embodiments of the present invention, it is proposed in light of the above described objects of the present invention that the above described third plate portion for the electrical connection purpose is made in the form of a substantially U-shape, a substantially semi-circular shape or a substantially trapezoidal form, for example.

Other objects and features of the present invention will be apparent from the following description in conjunction with the accompanying drawings.

BRIEF DESCRIPTION OF THE DRAWINGS

The preferred embodiments of the present invention will be described below with reference to the accompanying drawings.

FIG. 1 (A and B) are schematic views showing the construction and the arrangement of the prior art printed circuit assembly provided in a single lens reflex camera.

FIG. 3 (A and B) are schematic views showing the construction and arrangement of an example of the printed circuit assembly in accordance with the present invention when it is applied to a single lens reflex camera.

DETAILED DESCRIPTION OF THE PREFERRED EMBODIMENTS

Now, a description will be given below of an embodiment of the printed circuit assembly in accordance with the present invention wherein it is applied to a single lens reflex camera.

But, prior to the description of the present invention, a printed circuit assembly of the prior art incorporated in a single reflex camera will first be described.

Figure 1A:
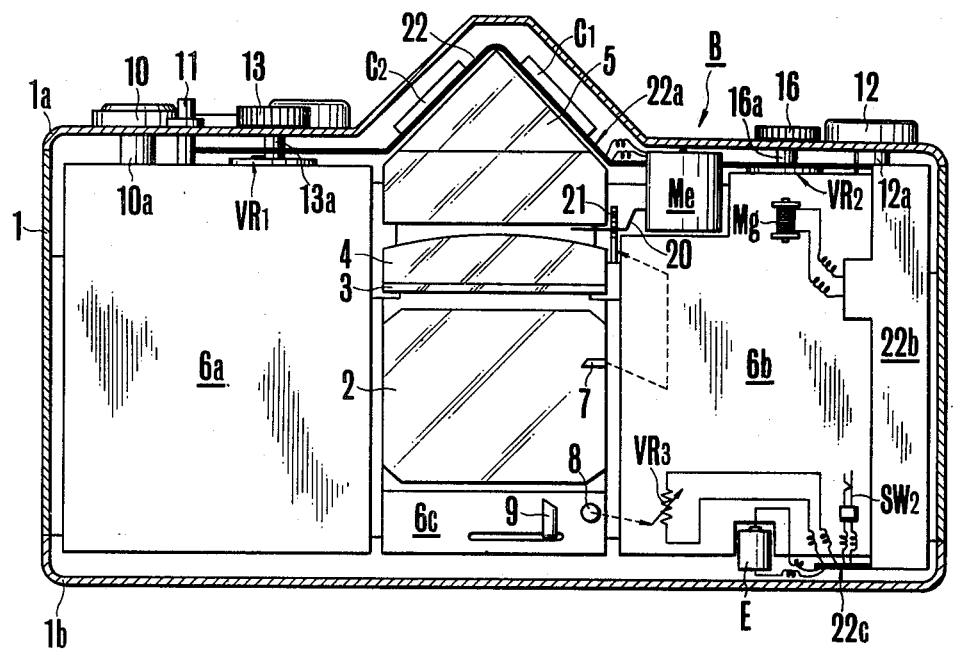
FIG. 1A being a schematic view as seen from the front side of the camera with the front portion of the camera housing being removed.
Figure 1B:
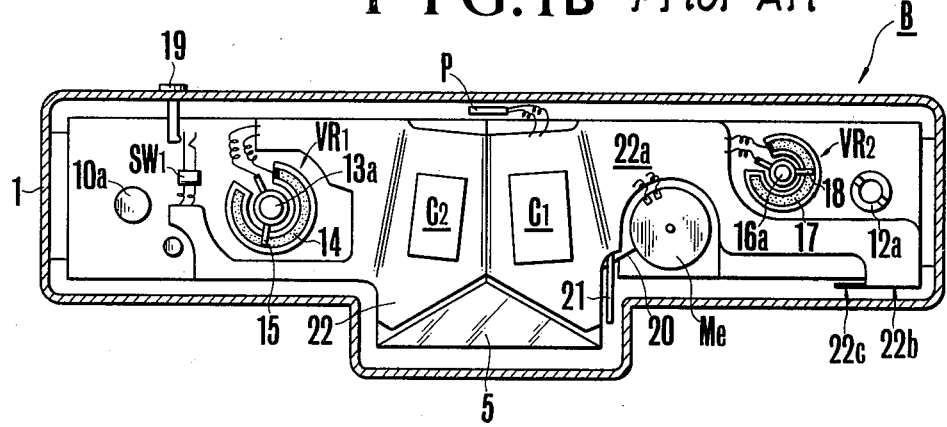
FIG. 1B being a schematic view as seen from the upper side of the camera with the upper portion of the camera housing being removed.

In FIGS. 1A and 1B, the reference character B designates the body of the single lens reflex camera, the reference numeral 1 designating the housing of the camera body B. The reference numeral 1a designates the upper cover of the housing 1, while 1b shows the bottom cover of the camera.

2 designates the well known swingable mirror in the single lens reflex camera, 3 shows the focusing plate, 4 the condenser lens, 5 the pentagonal roof prism, these 5 elements constituting the view finder optical system of the camera.

6a, 6b and 6c designate schematically the spaces in which various mechanical parts of the camera are housed, respectively. For example, the film winding mechanism, the shutter changing mechanism, the camera releasing mechanism and a portion of the focal plane shutter mechanism, etc. are housed in the space 6a, and the mirror swinging up mechanism, the film rewinding mechanism, the mechanism for automatically presetting the proper diaphragm aperture of the diaphragm mechanism in the interchangeable taking lens and the remaining portion of the shutter mechanism, etc. are arranged in the space 6b, while the full open F value input mechanism for receiving input of the full open F value of the interchangeable taking lens, the automatic stop down mechanism for actuating the diaphragm mechanism in the taking lens so as to set the diaphragm aperture to the pre-set value of the diaphragm, a portion of the shutter charging mechanism and a portion of the camera releasing mechanism, etc. are housed in the space 6c.

The numeral 7 designates the pre-set diaphragm aperture value transmitting lever constituting the above described diaphragm pre-setting mechanism, 8 designating the full open F value input pin constituting the above described full open F value input mechanism, 9 the automatic stop down lever constituting the above described stop down mechanism. (Incidentally, the above described various mechanisms are of the well known construction and, therefore, detailed illustration thereof is omitted from the drawings. However, such omission will not cause obstruction for understanding the present invention.)

The numeral 10 designates the film winding and shutter charging lever, the shaft 10a of which is coupled with the above described film winding mechanism and the shutter charging mechanism.

The numeral 11 designates the shutter button which is coupled with the above described shutter release mechanism.

The numeral 12 designates the film rewinding knob, the shaft 12a of which is coupled with the above described film rewinding mechanism.

The numeral 13 designates the shutter time setting dial, which is arranged on the upper cover 1a of the camera as shown in FIG. 1A, and the rotatable shaft 13a of the dial 13 is coupled with the variable resistor $VR_1$ for setting the shutter time which is arranged in the restricted space between the upper cover 1a and the space 6a in which the above described mechanism portion is housed. As shown in FIG. 1B, the variable resistor $VR_1$ is constituted by a resistance piece 14 and a shifting tap 15 adapted to be shifted on the resistance piece 14 in contact therewith and connected to the rotatable shaft 13a of the above described dial 13.

The numeral 16 designates the film sensitivity setting dial arranged on the upper cover 1a of the camera, the rotatable shaft 16a of which is connected to the variable resistor $VR_2$ for setting the film sensitivity which is arranged in the restricted space between the upper cover 1a and the space 6b in which the above described mechanism portion is housed. The variable resistor $VR_2$ is constituted by a resistance piece 17 and a shiftable tap 18 adapted to be shifted on the resistance piece 17 in contact therewith and coupled with the rotatable shaft 16a of the dial 16.

The reference character SW1 designates the power switch for the electrical circuit system of the camera, and this switch is arranged in the space between the upper cover 1a and the space 6a in which the mechanism portion is housed as shown in the drawing and is opened and closed by the switch actuating knob 19 (FIG. 1B) which is arranged at the outside of the housing 1.

The reference character Me designates the meter for indicating the diaphragm aperture value (i.e. the camera is shown as being the one in which the automatic exposure control is made possible with the shutter being preferentially operated), and this meter is so arranged in the space between the upper cover 1a of the camera and the space 6b housing therein the mechanism portion that the proper diaphragm aperture value for the photographing can be indicated within the field of view of the view finder of the camera by means of the pointer 20 of the meter Me.

Incidentally, the reference numeral 21 designates the clamp lever of the well known type adapted to clamp the pointer 20 of the meter Me at the time of releasing of the camera and it is mechanically connected to the above described pre-set diaphragm aperture value transmitting lever 7. Thus, the transmitting lever 7 is actuated at the time of releasing of the camera in response to the operating stroke of the clamp lever 21 from its initial position to the clamping position thereof. As a result, the diaphragm mechanism of the taking lens is automatically pre-set to the proper diaphragm aperture value as indicated by the pointer 20 of the meter Me.

The reference character Mg designates the electromagnet of the well known type which is used for releasing the arresting of the trailing shutter curtain of the focal plane type shutter, and it is arranged in a suitable position in the space between the space 6b housing therein the above described mechanism portion and the housing 1 so that it can actuate the above described shutter mechanism.

The reference character SW2 designates the switch of the well known type for counting the shutter time, and the switch SW2 arranged in a suitable position in the space between the space 6b for housing the mechanism portion and the bottom cover 1b of the camera so that it can be coupled with the shutter mechanism.

The reference character VR3 designates the variable resistor for receiving input of the full open F value of the interchangeable taking lens, and it is arranged in the space between the space for housing therein the mechanism portion and the bottom cover 1b of the camera so that it can be coupled with the full open F value input pin 8 so as to adjust the resistance value of the variable resistor.

The reference character E designates the electric cell for the power supply, and it is loaded in the camera by utilizing the space between the space 6b for housing the mechanism portion and the bottom cover 1b of the camera.

The reference character P (FIG. 1B) designates the light measuring photoelectric element, and it is arranged in the space between the pentagonal roof prism 5 and the upper cover 1a of the camera adjacent to the light emitting surface of the pentagonal roof prism 5 in facing relationship thereagainst.

Figure 8:
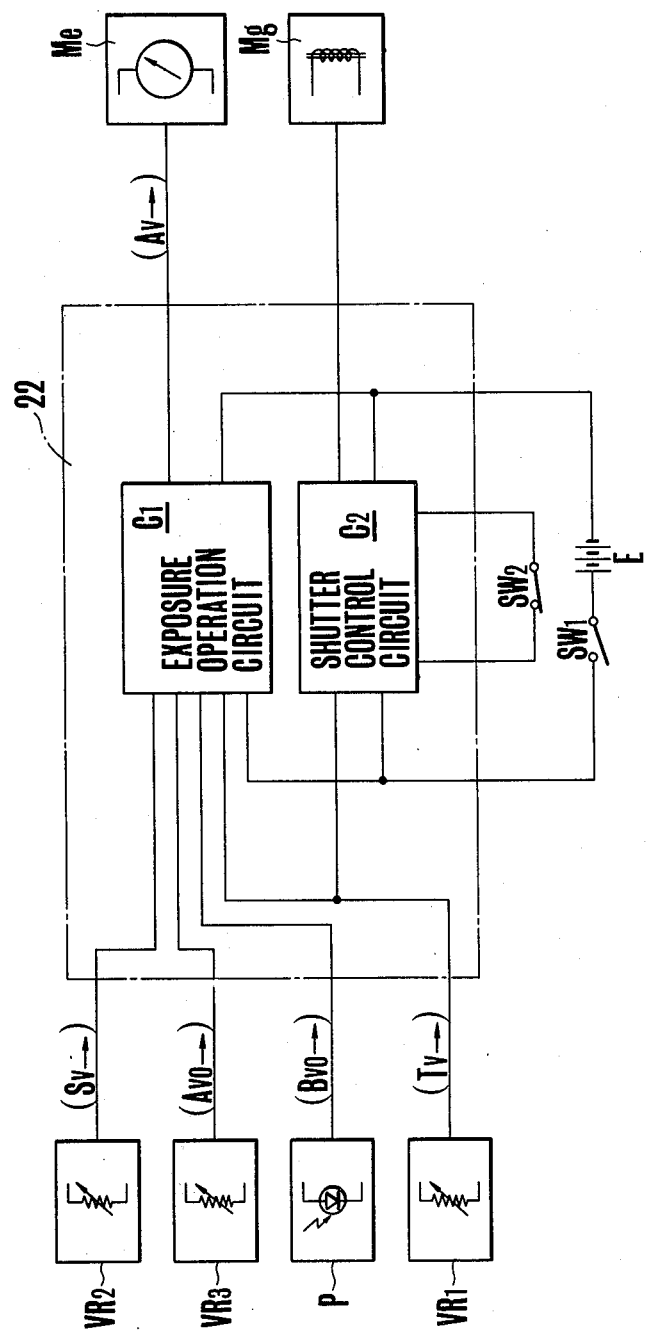
FIG. 8 is a block diagram showing an example of the basic construction of the electric exposure control system in the single lens reflex camera shown in FIGS. 1 and 3.

The reference numeral 22 designates a flexible electrically insulating printed circuit chip arranged in the restricted space in the manner as described above and having thereon printed conductors for electrically connecting various electrical parts distributedly arranged various restricted spaces in the housing 1 as described above, i.e. the switches SW1 and SW2, the variable resistors VR1 and VR2, and VR3, the light measuring element P, the meter Me, the electromagnet Mg and the electric cell E to the exposure operation circuit C1 and the shutter control circuit C2, and this printed circuit chip is arranged in variously bent state extending from the space between the upper side of the spaces 6a, 6b for housing the mechanism portion and the pentagonal roof prism 5 and the upper cover 1a of the camera through the space between the front side of the space 6b for housing the mechanism portion and the housing 1 to the space between the lower side of the space 6b for housing the mechanism portion and the bottom cover 1b of the camera. The above described exposure operation circuit C1 and the shutter control circuit C2 are arranged on the portion of the printed circuit chip 22 covering the roof surface of the pentagonal roof prism 5 in the most integrated manner as possible, and the electric cell E, the power switch SW1, the variable resistors VR1, VR2 and VR3, the light measuring element P and the meter Me are electrically connected to the exposure operation circuit C1 through the conductors formed on the printed circuit chip 22, while the electric cell E, the power switch SW1, the variable resistor VR1, the electromagnet Mg and the counting initiating switch SW2 are electrically connected to the shutter control circuit C2 in the similar manner through the conductors formed on the printed circuit chip 22 (FIG. 8).

In the camera having the construction as described above, when a taking lens (not shown) is mounted on the lens mount of the camera body B for the photographing purpose, the full open F value input mechanism including the full open F value input pin 8 is actuated so that the resistance value of the variable resistor VR3 for receiving the input of the full open F value is adjusted to a value corresponding to the full open F value of the taking lens mounted on the lens mount of the camera body B.

And, when the film sensitivity setting dial 16 is actuated to set the sensitivity of the film used in the camera, the tap 18 connected to the shaft 16a of the dial 16 is shifted in the resistance piece 17 in contact therewith so that the resistance value of the variable resistor VR2 for setting the film sensitivity is adjusted to a value corresponding to the sensitivity of the film used in the camera. Further, when the shutter time is adjusted to a desired value by operating the shutter time setting dial 13, the tap 15 coupled with the shaft 13a of the dial 13 is shifted on the resistance piece 14 in contact therewith so that the resistance value of the variable resistor VR1 for setting the shutter time is adjusted to a value corresponding to the selected shutter time as set by the dial 13.

Under such conditions, when the camera is directed to an object to be photographed and the power switch SW1 is closed by operating the actuating knob 19, the exposure operation circuit C1 is first actuated so that it effects operational exposure calculation well known in the art as shown in the following equation:

$$Sv + (Bvo + Avo) - Tv = Av$$

(where $Bvo + Avo$ represents the brightness of the object to be photographed as is well known in the art) on the basis of the information Tv of the shutter time as given by the variable resistor VR1, the information Sv of the film sensitivity as given by the variable resistor VR2, the information Avo of the full open F value of the taking lens as given by the variable resistor VR3 and the output Bvo of the light measuring element P, so that the proper diaphragm aperture value Av is obtained.

The value calculated by the operation circuit C1, i.e. the proper diaphragm aperture value Av is indicated in the field of view of the finder by the position of swinging of the pointer 20 of the meter Me.

Under such conditions, when the release button 11 is depressed, the clamp lever 21 is first actuated to clamp the pointer 20 of the meter Me in position and the transmitting lever 27 is actuated in response to the stroke of the clamp lever 21 so that the proper diaphragm aperture value as calculated by the exposure operation circuit C1 is pre-set in the diaphragm mechanism of the taking lens, and then the automatic diaphragm stop down mechanism is actuated so as to stop down the diaphragm of the taking lens to the pre-set proper diaphragm aperture value by the operation of the diaphragm mechanism.

Thereafter, the mirror swinging up mechanism is actuated to swing up the mirror 2 out of the optical path of the taking lens followed by the actuation of the shutter releasing mechanism which releases the leading shutter curtain of the focal plane type shutter (not shown).

As the leading shutter curtain commences movement for opening the shutter, the counting initiating switch SW2 is opened in coupled relationship with the commencement of movement of the leading shutter curtain so that the shutter control circuit C2 commences counting of the shutter time set in the variable resistor VR1 and, upon completion of the counting of the shutter time, the electromagnet Mg is energized to free the arresting of the trailing shutter curtain (not shown) thereby terminating the exposure for achieving the proper shutter time.

Figure 2:
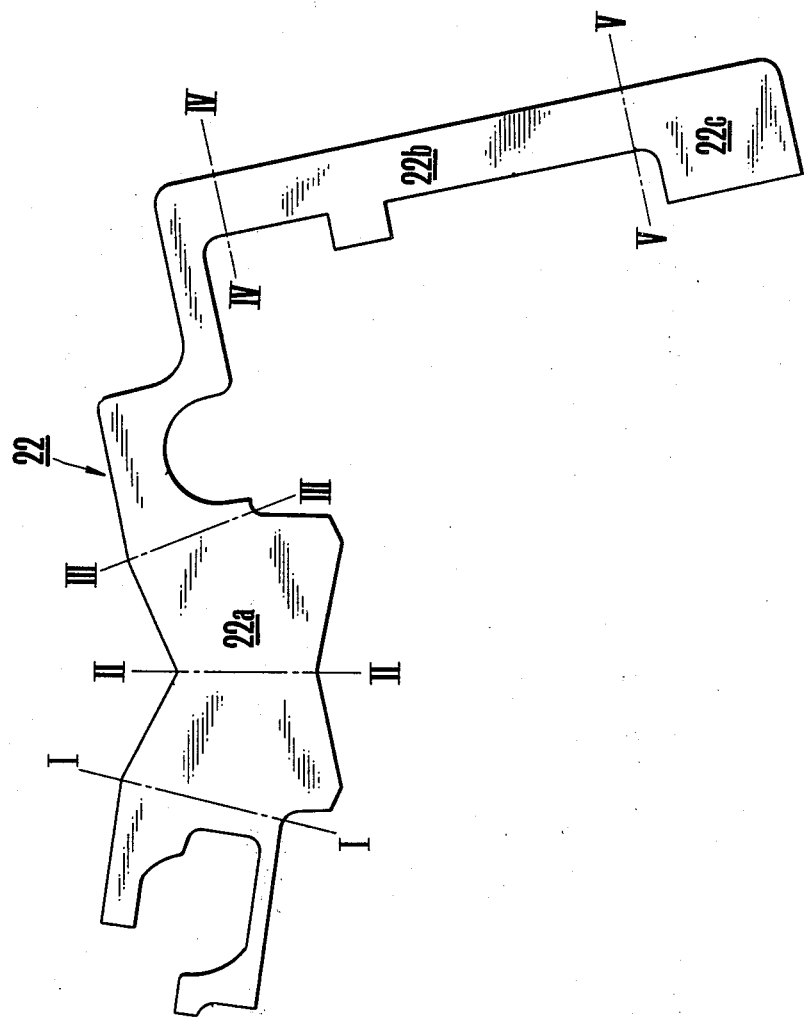
FIG. 2 is a plan view showing the flexible printed circuit chip in the printed circuit assembly shown in FIG. 1 in its developed state in a plane.

The flexible printed circuit chip 22 in the printed circuit assembly provided in the camera body B shown in FIG. 1 is, roughly speaking, constituted by a first main plate portion 22a arranged in the space between the upper sides of the spaces 6a, 6b housing the mechanism portions as well as the pentagonal roof prism 5 and the lower side of the upper cover 1a of the camera, the second main plate portion 22b arranged in the space between the front side of the space 6b for housing the mechanism portion and the housing 1 and a third main plate portion 22c arranged in the space between the lower side of the space 6b for housing the mechanism portion and the bottom cover 1b of the camera, and, when the printed circuit chip 22 is developed in a plane, the configuration of the chip 22 is substantially in the L-shape as shown in FIG. 2.

In FIG. 2, I—I, II—II ... V—V show the bent lines, respectively, and the printed circuit chip 22 is bent along the bent lines I—I, II—II ... V—V so as to be fitted in the camera body B.

Therefore, when the prior art flexible printed circuit chip 22 having the L-shape as shown in FIG. 2 is to be formed from a plate material as a continuous base plate, the yield of the material for forming the chip 22 is very low and waste portions of the material increases thereby making it impossible to lower the price of the printed circuit chip.

Now, a description will be given below of an example of the printed circuit assembly in accordance with the present invention with reference to FIGS. 3-5, which is applied to a single lens reflex camera having the construction shown in FIG. 1.

Figure 6:
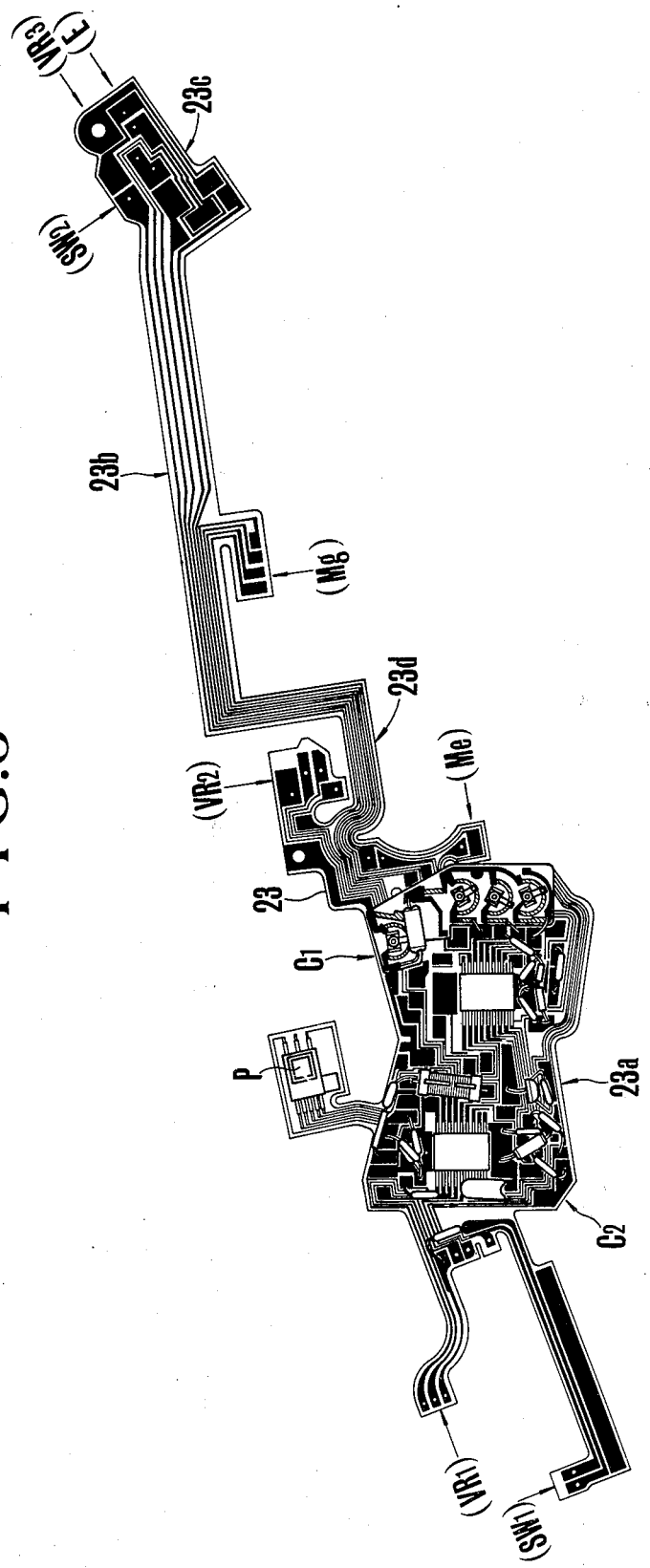
FIG. 6 is a plan view showing the construction of an embodiment of the printed circuit assembly shown in FIG. 3.

The construction of the camera body B shown in FIG. 3 is similar to that shown in FIG. 1 and, hence, the construction and arrangement of the electrical exposure control system is such as shown in FIG. 6, therefore, the description of the construction and the operation thereof are omitted, and only the improvements in the flexible printed circuit chip afforded by the present invention will be described below.

Figure 3A:
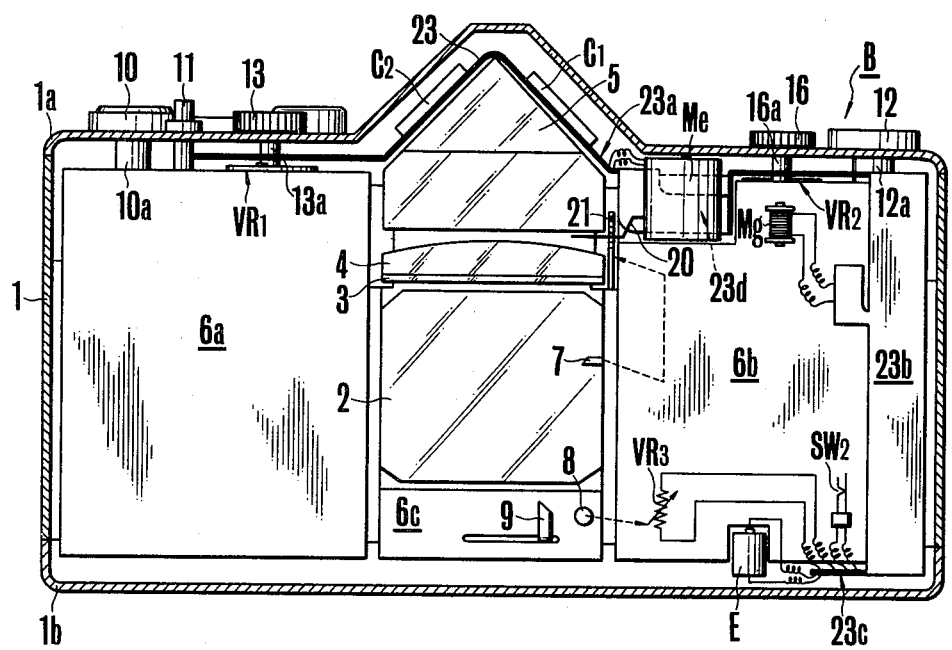
FIG. 3A being a schematic view as seen from the front side of the camera with the front portion of the camera housing being removed.
Figure 3B:
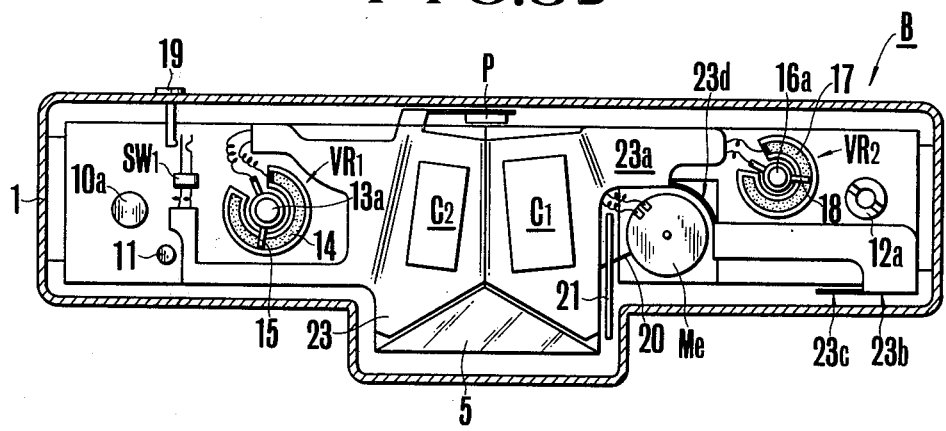
FIG. 3B being a schematic view as seen from the upper side of the camera with the upper portion of the camera housing being removed.

The flexible printed circuit chip related to the improvements in accordance with the present invention is shown in FIGS. 3A and 3B by the reference numeral 23.

In the similar manner as the prior art printed circuit chip 22 shown in FIGS. 1 and 2, the printed circuit chip 23 of the present invention is constituted by a first main plate portion 23a arranged in the space between the upper sides of the spaces 6a and 6b for housing the mechanism portions as well as the pentagonal roof prism 5 and the lower side of the upper cover 1a of the camera, a second main plate portion 23b arranged in the space between the front side of the space 6b for housing the mechanism portion and the housing 1 and a third main plate portion 23c arranged in the space between the lower side of the space 6b for housing the mechanism portion and the bottom cover 1b of the camera in such a manner that the first, the second and the third main plate portion 23a, 23b and 23c extend at an obtuse angle [the "obtuse angle" referred to in this specification is used to define the range between 90° (including 90°) and 180° (including 180°]to each other, but a further fourth plate portion 23d is included which is joined to the first and the second main plate portion 23a and 23b between them in such a manner that the fourth plate portion 23d is located so as to deviate from the directions in which the first and the second main plate portion 23a and 23b extend, the fourth plate portion 23d being arranged between meter Me and the space 6b for housing the mechanism portion so that it is located around the meter Me thereby permitting the second main plate portion 23b to be arranged in the space between the front side of the space 6b for housing the mechanism portion and the housing 1 in substantially perpendicularly intersecting relationship to the first main plate portion 23a as shown in FIG. 3.

Thus, the above described printed circuit chip 23 can be arranged in variously bent manner in the similar way as in the case of the prior art printed circuit chip 22 described previously extending from within the space between the upper sides of the spaces 6a and 6b for housing the mechanism portions as well as the pentagonal roof prism 5 and the lower side of the upper cover 1a of the camera through the space between the front side of the space 6b for housing the mechanism portion and the housing 1 to the space between the lower side of the space 6b for housing the mechanism portion and the bottom cover 1b of the camera.

Figure 4:
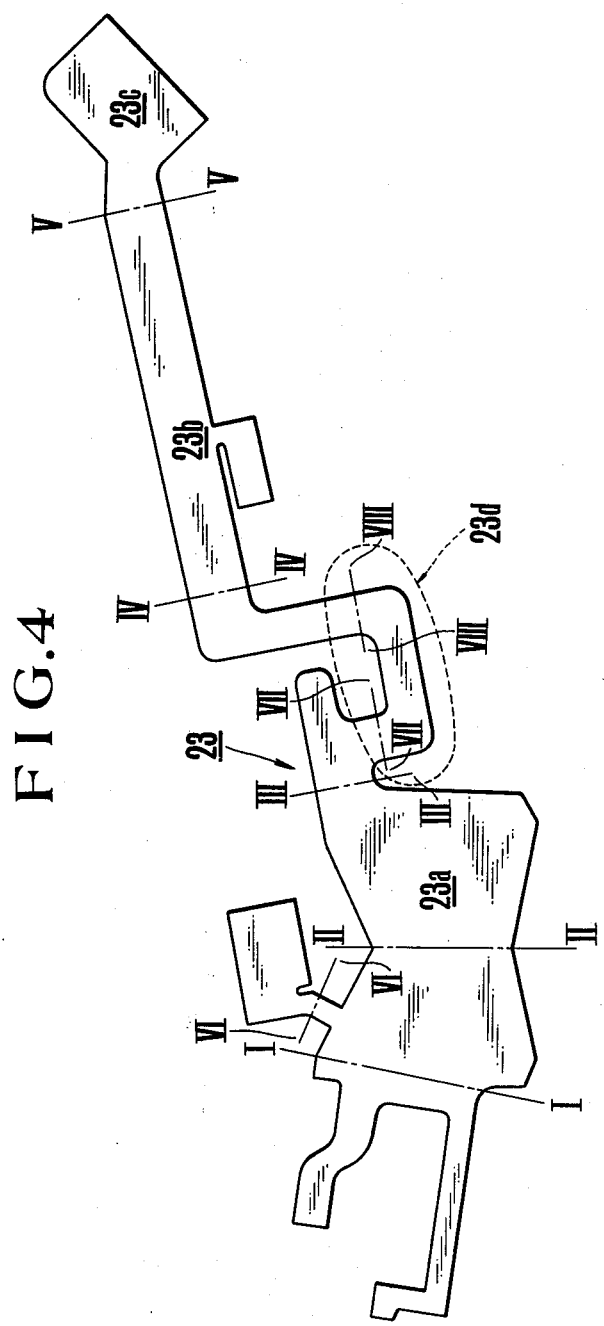
FIG. 4 is a schematic view showing the flexible printed circuit chip in the printed circuit assembly shown in FIG. 3 in its developed state in a plane.
Figure 5:
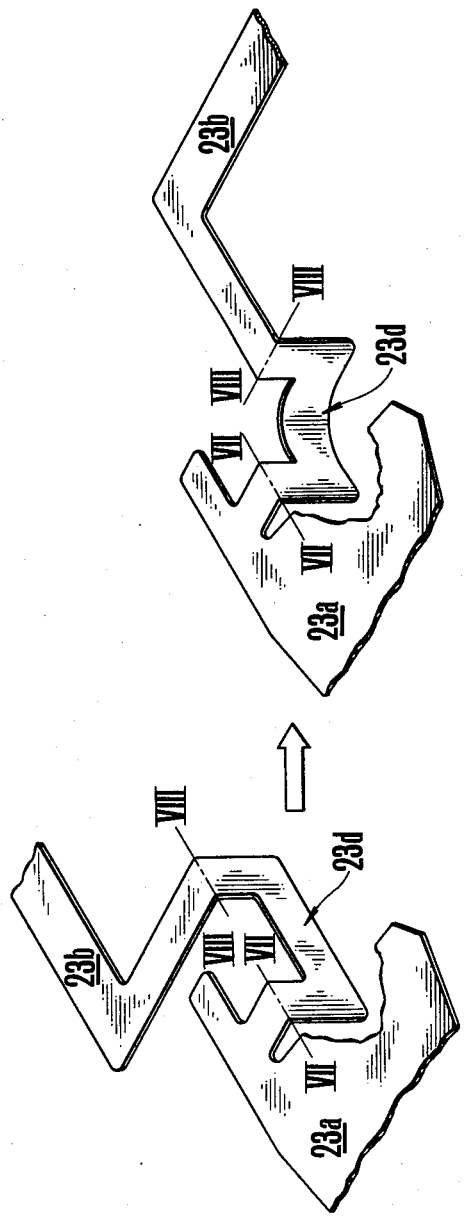
FIG. 5 is a perspective view illustrating the manner of bending of the main portion of the printed circuit chip shown in FIG. 4 which is related to the improvement in accordance with the present invention.

Since the fourth plate portion 23d having the particular shape as described above is provided between the first and the second main plate portion 23a and 23b, the printed circuit chip 23 is made in the generally elongated form extending along a single direction as shown in FIG. 4 when the printed circuit chip 23 is developed in one plane.

The reference numerals I—I, II—II . . . VIII—VIII given in FIG. 4 show bent lines along which the printed circuit chip 23 is to be bent so as to be accommodated in the camera body B, as shown particularly in FIG. 5, the fourth plate portion 23d is bent at its both arm portions along the bent lines VII—VII and VIII—VIII with respect to the plate portions 23a, 23b and 23c substantially at a right angle, and, thereafter, the fourth main plate portion 23d is bent in the arcuate form so that the second main plate portion 23b is positioned in substantially perpendicularly oriented relationship with respect to the first main plate portion 23a.

FIG. 6 shows an embodiment of the printed circuit assembly of the present invention in which the exposure operation circuit $C_1$ and the shutter control circuit $C_2$ are carried on the flexible electrically insulating printed circuit chip 23 in the most integrated form as possible together with the conductors for electrically connecting the various electrical parts, i.e. the variable resistors VR1, VR2 and VR3, the light measuring element P, the switches SW1 and SW2, the meter Me, the electromagnet Mg and the electric cell E to the circuits C1 and C2. The arrows given in the drawing show the connecting points of these electrical parts.

The example of the present invention has been described above as the improved printed circuit chip 23 with reference to FIGS. 3-6 in which the fourth plate portion 23d having the special configuration for the connecting purpose is bent in arcnate form. However, the configuration of the fourth plate portion 23d can be variously varied in other shapes than the U-shape.

Figure 7:
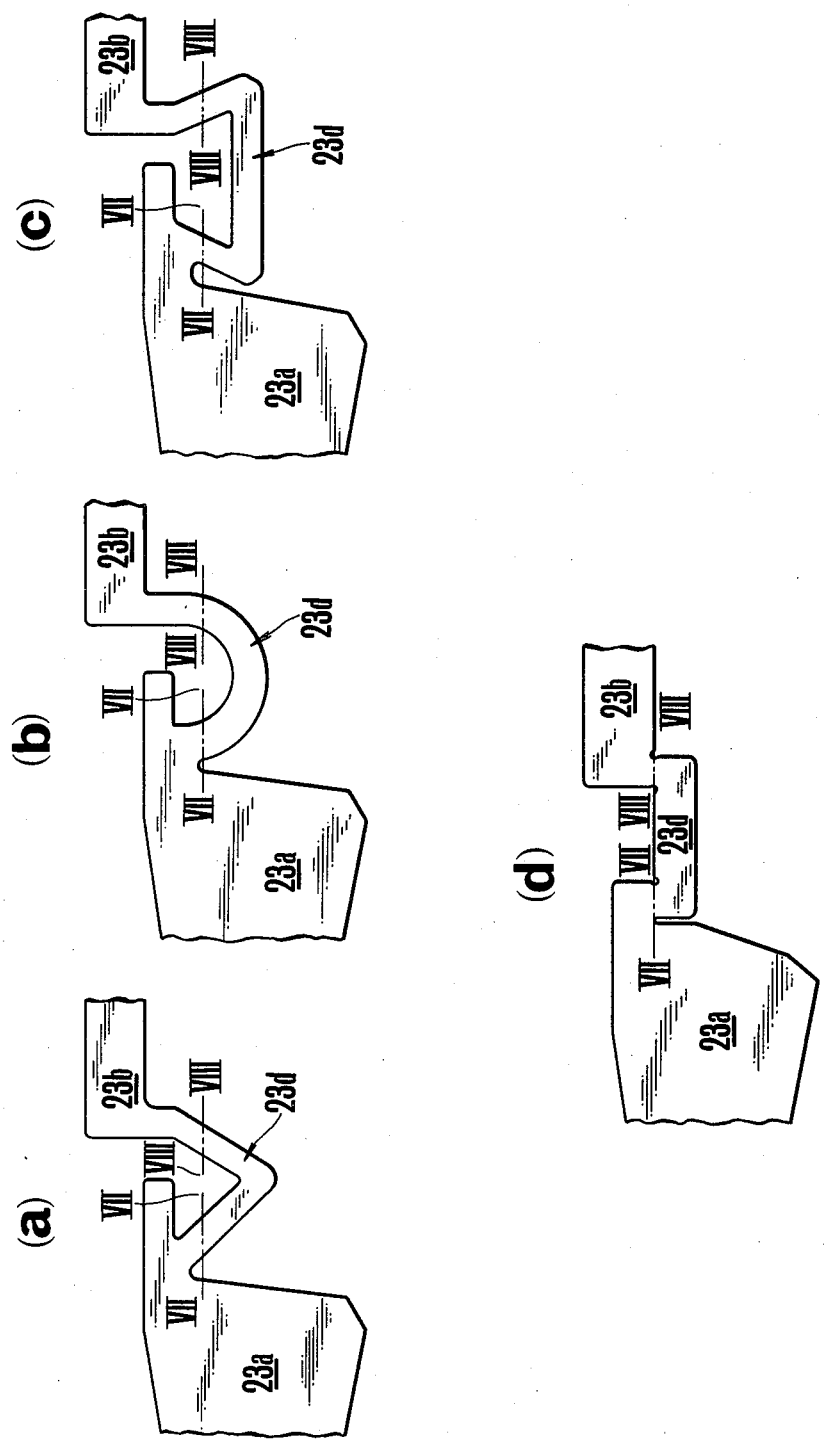
FIG. 7 is a schematic view showing an alternative embodiment of the main portion of the printed circuit chip shown in FIG. 4, the portion being related to the improvement in accordance with the present invention.

That is, various variations in the configuration of the fourth plate portion 23d are illustratively shown in FIG. 7, FIG. 7(a) showing the example of the fourth plate portion 23d in substantially V-shape, FIG. 7(b) showing the example of the fourth plate portion 23d substantially in the semi-circular form, FIG. 7(c) showing the example of the fourth plate portion 23d substantially in the trapezoidal form, while FIG. 7(d) shows the example of the fourth plate portion 23d wherein the plate portion 23d is formed as a single strip extending in one direction and the strip is joined at its portions in the major side thereof to the first and the second main plate portion 23a and 23b.

As described above, since the printed circuit chip in the printed circuit assembly in accordance with the present invention is provided with a third plate portion for the connecting purpose which is joined to at least a first and a second main plate portion extending at an obtuse angle to each other in such a manner that the third plate portion for the connecting purpose is located between the first and the second main plate portion so as to deviate from the directions in which the first and the second main plate portion extend, the printed circuit chip of the present invention can be made in the generally elongated form when it is developed in one plane even though it must be adapted to be fitted in the various configurations of the spaces by variously bending the printed circuit chip. Therefore, the yield of the material for forming the printed circuit chip can be extremely raised when it is formed from the material as a single continuous base plate and the waste portions of the material can be reduced thereby making it possible to largely lower the price of the printed circuit chip.

As to the embodiment of the present invention, the one having only a single third plate portion for the connecting purpose has been described. However, the number of the third plate portion for the connecting purpose should not be limited to one in the present invention, but it can be increased to two or more thereby permitting the yield of the material for forming the printed circuit chip to be surprisingly raised even though it must be accommodated in the space having a very complicated configuration.

In accordance with the present invention, the configuration of the third plate portion for the connecting purpose may be variously varied other than those shown in FIGS. 3-7.

What is claimed is:

1. A control circuit assembly in a device provided with:
    a housing,
    a plurality of mechanical parts compactly mounted in said housing, and
    a plurality of electrical parts distributed within a plurality of restricted spaces between said housing and said mechanical parts, said assembly comprising:
    (a) a flexible electrically insulating circuit support substrate, said flexible support substrate being bent into a configuration to fit into a plurality of said restricted spaces within said housing,
    (b) control circuit means for controlling at least one mechanical part of said plurality of mechanical parts, said circuit means being mounted on said substrate, and
    (c) a plurality of electrical conductors for electrically connecting said plurality of electrical parts to said control means, said conductors being carried on said substrate and electrically connected to said control circuit means,
    said plurality of electrical parts being electrically connected to said control circuit means through said conductors.
    said flexible substrate being a single continuous substrate having a generally elongated shape in its extended state and having first and second substrate portions and a third substrate portion connecting said first and second portions with each other, said third portion being connected with said first and said second portions at first and second connecting sections and being bent at a first place in the vicinity of said first section, and at a second place in the vicinity of said second section, and at a third place between said first and second sections; an angle between said first and said second portions being varied in accordance with the change in the bending angle of said third portion at the third place so that said first and said second portions are arranged in said restricted spaces;
    the third portion, when the substrate is flat, having a first edge extending from the first portion to the second portion along a line which departs from a straight line and having a second edge which extends from the first portion to the second portion, said substrate being bent at the first and second places so that the third portion is substantially transverse to planes formed by the first and second portions in the vicinity of the first and second places, said first and second portions extending in longitudinal directions with an angle therebetween which depends upon the bending angle at the third place.

2. A control circuit assembly as claimed in claim 1, wherein said control circuit means comprises an integrated circuit chip carried on said elongated flexible substrate intermediate the ends thereof;
    a first group of said plurality of conductors extending from said integrated circuit chip in a direction toward a first end of said elongated flexible substrate and a second group of said plurality of conductors extending from said integrated circuit chip in a direction toward a second end of said elongated flexible substrate.

3. A control circuit assembly as claimed in claim 1, wherein said flexible substrate has an irregular shape adapted to cooperate with said bent configuration for causing said flexible substrate to fit in said restricted space within said housing.

4. A control circuit assembly as claimed in claim 1, wherein said flexible substrate is made of a flexible solid organic resin.

5. A control circuit assembly as claimed in claim 4, wherein said third portion of said flexible substrate has substantially a general U-shape.

6. A control circuit assembly as claimed in claim 4, wherein said third portion of said flexible support substrate has a substantially V-shape.

7. A control circuit assembly as claimed in claim 4, wherein said third portion of said flexible substrate has a substantially trapezoidal shape.

8. A control circuit assembly as claimed in claim 4, wherein said third portion of said flexible substrate is in a strip form having a major side, said third portion being joined to said first and second portions at two different locations along said major side.

9. An exposure control circuit assembly in a camera having:
    a camera housing;
    a plurality of mechanical parts adapted to be actuated for exposure, said plurality of mechanical parts and the housing forming a plurality of restricted spaces within said camera housing, and
    a plurality of electrical parts to electrically control the actuation of the exposure, said plurality of electrical parts being distributed in said housing among the restricted spaces between said camera housing and said mechanical parts; said exposure control circuit assembly comprising:
    (a) a flexible electrically insulating circuit support sheet, said flexible support sheet being bent into a configuration to fit in said restricted space within said camera housing;
    (b) exposure control circuit means for electrically controlling the actuation of the exposure of said camera, said control circuit means being carried on said support sheet, and
    (c) a plurality of electrical conductors for electrically connecting said plurality of electrical parts to said control circuit means, said conductors being electrically connected to said control circuit means,
    said plurality of electrical parts being electrically connected to said control means through said conductors,
    said flexible sheet being a single continuous substrate having a generally elongated shape in its extending state and having first and second sheet portions and a third sheet portion connecting said first and said second portions with each other, said third portion being connected with said first and second portions at first and second connecting sections and being bent at a first place in the vicinity of said first section, at a second place in the vicinity of said second section, and at a third place between said first and second sections, the angle between said first and second portions being varied in accordance with the change in the bending angle of the third portion at the third place so that the first and second portions are arranged in said restricted space;

the third portion, when the substrate is flat, having a first edge extending from the first portion to the second portion along a line which departs from a straight line and having a second edge which extends from the first portion to the second portion, said substrate being bent at the first and second places so that the third portion is substantially transverse to planes formed by the first and second portions in the vicinity of the first and second portions extending in longitudinal directions with an angle therebetween which depends upon the bending at the third place.

10. An exposure control circuit assembly as in claim 9, wherein said exposure control circuit means comprises an integrated circuit chip carried on said first portion of said elongated flexible support sheet, a first group of said plurality of conductors extending from said integrated circuit chip in a direction toward a first end of said elongated flexible support sheet and a second group of said plurality of conductors extending from said integrated circuit chip in a direction toward a second end of said elongated flexible support sheet via said third portion.

11. An exposure control circuit assembly as in claim 10, wherein said flexible support sheet has an irregular shape adapted to cooperate with said bent configuration for causing said flexible support plate to fit in said restricted space within said camera housing.

12. An exposure control circuit assembly as in claim 10, wherein said flexible support sheet is made of a flexible solid organic resin.

13. An exposure control circuit assembly as in claim 12, wherein said third portion of said flexible support sheet is substantially U-shaped.

14. An exposure control circuit assembly as in claim 12, wherein said third plate portion of said flexible support sheet is substantially V-shaped.

15. An exposure control circuit assembly as in claim 12, wherein said third portion of said flexible support sheet has a substantially trapezoidal shape.

16. An exposure control circuit assembly as in claim 12, wherein said third portion of said flexible support plate is in the form of a strip having a major side, said third plate portion being joined to the first and second major main portions at two different points in said major side to said first and second main portions.

17. An exposure control circuit assembly as in claim 10, wherein:

said plurality of mechanical parts include a diaphragm mechanism for defining the aperture for photographing, and said plurality of electrical parts include electrical means to electrically control said diaphragm mechanism, said exposure control circuit means including:

a diaphragm control circuit for adjusing the exposure aperture in response to the brightness of the scene to be photographed, said diaphragm control circuit being electrically connected to said electrical means through said electrical conductors.

18. An exposure control circuit assembly as in claim 10, wherein:

said plurality of mechanical parts include a shutter mechanism, and said plurality of electrical parts include first electrical means for electrically presetting the exposure time and second electrical means for actuating said shutter mechanism, said exposure control circuit means including:

a shutter control circuit for controlling the operation of said shutter mechanism, said shutter control circuit being electrically connected to said first and second electrical means through said electrical conductors and being adapted to control the exposure time by controlling said second electrical means on the basis of the preset exposure time set by said first electrical means.

19. An exposure control circuit assembly as in claim 9, wherein said exposure control circuit means includes an automatic exposure control circuit for automatically controlling the exposure of the camera in response to the brightness of the scene to be photographed.

20. An electronic integrated circuit exposure control assembly for controlling the operation of an exposure aperture regulating camera sub-assembly including a diaphragm mechanism regulating the exposure aperture of the camera and electrical means adapted to control said diaphragm mechanism, said exposure control assembly comprising:

(a) a flexible electrically insulating base sheet, said base sheet being bent into a configuration to fit in a desired space within a camera housing, (b) exposure control integrated circuit means for adjusting the exposure aperture of the camera in response to the brightness of the scene to be photographed, said integrated circuit means being carried on said base sheet, and (c) electrical conductive paths carried on said base sheet, said conductive paths being electrically connected to said integrated circuit means and being adapted to electrically connect said integrated circuit means to said electrical means, said flexible base sheet being a single continuous sheet made of a flexible solid resin and having a generally elongated shape in its extended state and having a first and a second sheet portion and a third sheet portion connecting said first aand second portions together, said third portion being connected to said first and second portions at first and second connecting sections and being bent at a first place in the vicinity of said first section, at a second place in the vicinity of said second section and at a third place between said first and second sections, the angle between the first and second portions being varied in accordance with the change in the bending angle of the third portion at the third place so that said first and second portions are arranged in said desired space, the third portion, when the substrate is flat, having a first edge extending from the first portion to the second portion along a line which departs from a straight line and having a second edge which extends from the first portion to the second portion, said substrate being bent at the first and second places so that the third portion is substantially transverse to planes formed by the first and second portions in the vicinity of the first and second places, said first and second portions extending in longitudinal directions with an angle therebetween which depends upon the bending angle at the third place.

21. An electronic integrated circuit exposure control assembly for controlling the operation of an exposure time regulating camera sub-assembly including a shutter mechanism, first electrical means for electrically setting the exposure time and second electrical means for operating said shutter mechanism, said exposure control assembly comprising:
(a) a flexible electrically insulating base sheet, said base sheet being bent into a configuration to fit in a desired space within a camera housing,
(b) exposure control integrated circuit means for controlling the operation of said shutter mechanism, said circuit means being carried on said base sheet, and
(c) electrical conductive paths carried on said base sheet, said conductive paths being electrically connected to said integrated circuit means and being adapted to electrically connect said integrated circuit means to said first and second electrical means,
said integrating circuit means being adapted to control the exposure time by controlling said second electrical means on the basis of the preset exposure time set by said first electrical means,
said base plate being fromed as a single continuous flexible solid organic resin sheet,
said flexible base sheet being a single continuous sheet made of a flexible solid resin having a generally elongated shape in its extended state and having a first and a second sheet portion and a third sheet portion connecting said first and second portions together, said third portion being connected with said first and second portions at first and second connecting sections and being bent at a first place in the vicinity of said first section, at a second place in the vicinity of said second section and at a third place between said first and second sections, the angle between the first and second portions being varied in accordance with the change in the bending angle of the third portion at the third place so that said first and second portions are arranged in said desired space,
the third portion when the substrate is flat, having a first edge extending from the first portion to the second portion along a line which departs from a straight line and having a second edge which extends from the first portion to the second portion, said substrate being bent at the first and second places so that the third portion is substantially transverse to planes formed by the first and second portions in the vicinity of the first and second places, said first and second portions extending in longitudinal directions with an angle therebetween which depends upon the bending angle at the third place.

22. An electronic integrated circuit exposure control assembly for controlling the operation of one or more camera sub-assemblies relating to the exposure operation, said exposure control assembly comprising:
(a) a flexible electrically insulating base sheet, said base sheet being bent into a configuration to fit in a desired space within a camera housing,
(b) exposure control integrated circuit means for controlling the operation of said one or more camera sub-assemblies in response to the brightness of the scene to be photographed,
said second means being carried on said base sheet, and
(c) electrical conductive paths carried on said base sheet, said conductive paths being electrically connected to said integrated circuit means and being adapted to electrically connect said integrated circuit means to said one or more camera sub-assemblies,
said base plate being formed as a single continuous flexible solid organic resin sheet,
said flexible base sheet being a single continuous sheet made of a flexible solid resin having a generally elongated shape in its extended state and having a first and a second sheet portion and a third sheet portion connecting said first and second portions together, said third portion being connected with said first and second portions at first and second connecting sections and being bent at a first place in the vicinity of said first section and, at a second place in the vicinity of said said second sections, the angle between the first and second portions being varied in accordance with the change in the bending angle of the third place at the third section so that said first and second portions are arranged in the desired space,
the third portion, when the substrate is flat, having a first edge extending from the first portion to the second portion along a line which departs from a straight line and having a second edge which extends from the first portion to the second portion, said substrate being bent at the first and second places so that the third portion is substantially transverse to planes formed by the first and second portions in the vicinity of the first and second places, said first and second portions extending in longitudinal directions with an angle therebetween which depends upon the bending angle at the third place.

23. An electronic integrated circuit camera control assembly for controlling the operation of one or more camera sub-assemblies, said camera control assembly comprising:
(a) a flexible electrically insulating base sheet, said base sheet being adapted to be bent into a configuration so as to fit in a desired space within a camera housing,
(b) camera control integrated circuit means for controlling the operation of one or more camera sub-assemblies, said integrated circuit means being carried on said base sheet, and
(c) electrically conductive paths carried on said base sheet, said conductive paths being electrically connected to said integrated circuit means and being adapted to electrically connect said integrated circuit means to said one or more camera sub-assemblies,
said base sheet being formed as a single continuous flexible solid organic resin sheet,
said flexible base sheet being a single continuous sheet made of a flexible solid resin having a generally elongated shape in its extended state and having a first and a second sheet portion and a third sheet portion connecting said first and second portions together, said third portion being connected with said first and second portions at the first and second connecting sections and being bent at a first place in the vicinity of said first section, at a second place in the vicinity of said second section and at a third place between said first and second sections, the angle between the first and second portions being varied in accordance with the change in the bending angle of said third portion at the third place so that said first and second portions are arranged in the desired space, the third portion, when the substrate is flat, having a first edge extending from the first portion to the second portion along a line which departs from a straight line and having a second edge which extends from the first portion to the second portion, said substrate being bent at the first and second places so that the third portion is substantially transverse to planes formed by the first and second portions in the vicinity of the first and second places, said first and second portions extending in longitudinal directions with an angle therebetween which depends upon the bending angle at the third place.

24. A camera comprising:

a housing, a plurality of operation control members in the housing, said members and said housing forming a plurality of spaces in the housing, an electrical circuit arrangement in the spaces, said electrical circuit arrangement including circuitry coupling the control members and a flexible substrate supporting the circuitry and having two elongated flat sections each with a flat portion and an intermediate portion joining the flat portions, the flat portions forming planes substantially parallel to each other, the substrate supporting the circuitry having the intermediate portion bent within the housing to a position substantially transverse to the flat portions and shaped to form a gap between the flat portions and having the elongated flat sections substantially aligned when the substrate is laid flat;

said intermediate portion being bent around one of the control members in the housing and around an axis substantially transverse to the planes of the flat portions, so that said flat portions extend longitudinally at an angle to each other which depends upon the degree to which the intermediate portion is bent about the axis transverse to the flat portion.

25. A camera as in claim 24, wherein said intermediate portion is bent around one of the control members in the housing and being bent around an axis transverse to the elongated direction of one of the flat sections and parallel to the elongated direction of the other flat section and wherein said intermediate member is bent to a position substantially transverse to the flat position along two separate substantially parallel elongated arcs of the substrate.

26. A camera as in claim 25, wherein said one of the control members is an exposure meter having a cylindrical outer casing; and said intermediate portion is bent so as to surround a portion of the cylindrical outer casing of the exposure meter.

27. A camera as in claim 24, wherein said housing includes a top wall and a front wall; and said one of the flat sections is laid along said top wall and said other section is laid along said front wall.

28. A camera as in claim 27, wherein said housing further includes a bottom wall; and said other section is bent between said front wall and said bottom wall, and a top portion of said other section is laid along the bottom wall.

* * * * *

UNITED STATES PATENT OFFICE
CERTIFICATE OF CORRECTION

Patent No. 4,227,788  Dated  Oct. 14, 1980

Inventor(s)  Masami Shimizu, et al

It is certified that error appears in the above-identified patent and that said Letters Patent are hereby corrected as shown below:

In the heading of the Patent [30] should read as follows:

[30]  Foreign Application Priority Data:

Nov. 5, 1975...[JP]  Japan............50-150409

Signed and Sealed this

Sixth Day of January 1981

[SEAL]

Attest:

Attesting Officer

SIDNEY A. DIAMOND

Commissioner of Patents and Trademarks